United States Patent [19]

Itoh

[11] Patent Number: 5,119,336
[45] Date of Patent: Jun. 2, 1992

[54] MEMORY WRITE PROTECTION CIRCUIT

[75] Inventor: Morihiko Itoh, Tokyo, Japan

[73] Assignee: NEC Corporation, Japan

[21] Appl. No.: 412,507

[22] Filed: Sep. 26, 1989

[30] Foreign Application Priority Data

Sep. 27, 1988 [JP] Japan .................................. 63-242742

[51] Int. Cl.⁵ .............................................. G11C 7/00
[52] U.S. Cl. ..................... 365/195; 365/228; 364/246.8; 364/969.2
[58] Field of Search ................. 364/246.8; 365/228, 365/195

[56] References Cited

U.S. PATENT DOCUMENTS

| | | | |
|---|---|---|---|
| 4,472,790 | 9/1984 | Burk et al. | 364/900 |
| 4,589,092 | 5/1986 | Mattick | 364/900 |
| 4,636,986 | 1/1987 | Pinkham | 365/195 |
| 4,744,062 | 5/1988 | Nakamura et al. | 365/228 |
| 4,811,299 | 3/1989 | Miyazawa et al. | 365/193 |
| 4,813,024 | 3/1989 | Lisimaque et al. | 365/228 |
| 4,831,597 | 5/1989 | Fuse | 365/193 |
| 4,926,388 | 5/1990 | Kunita et al. | 365/228 |
| 4,931,993 | 6/1990 | Urushima | 365/228 |

Primary Examiner—Joseph E. Clawson, Jr.
Attorney, Agent, or Firm—Laff, Whitesel, Conte & Saret

[57] ABSTRACT

A memory has a plurality of areas, anyone of which may be assigned a status from a central control unit as to whether it is writable or non-writable and as to whether it is or is not write protected. When an order to write is received, a deciding circuit indicates the status assigned to the pertinent memory area. A certain period of time is measured during which write protection may be canceled if a predetermined procedure is followed. Then the deciding circuit gives or denies writing access according to the assigned status and to whether a proper protection cancellation procedure has been followed.

4 Claims, 10 Drawing Sheets

| OUTPUT OF SELECTOR 12 (STATE OF F·F SELECTED BY SELECTOR 12) | H (WE) | H (WE) | L (WD) | L (WD) |
|---|---|---|---|---|
| OUTPUT OF SELECTOR 13 (STATE OF F·F SELECTED BY SELECTOR 13) | H (DTMP-OFF) | L (DTMP-ON) | H (DTMP-OFF) | L (DTMP-ON) |
| KIND OF AREA | WE AREA | DTMP AREA | WD AREA | WD AREA |

MEMORY WRITE PROTECTION CIRCUIT

BACKGROUND OF THE INVENTION

1. Field of the Invention

The present invention generally relates to a circuit for setting conditions for giving a central control circuit access to a read-write memory (RWM) and, more particularly, to a memory write protection circuit for establishing predetermining conditions under which a CPU may write data in an RWM.

2. Description of the Prior Art

Electronic equipment or system of the kind using RWM is in many cases furnished with a write protection circuit for preventing data from being destroyed due to careless or erroneous accesses to the RWM. Specifically, the write protection circuit inhibits the writing of data in the RWM unless a predetermined procedure is performed on a data processing unit.

Figure 1:
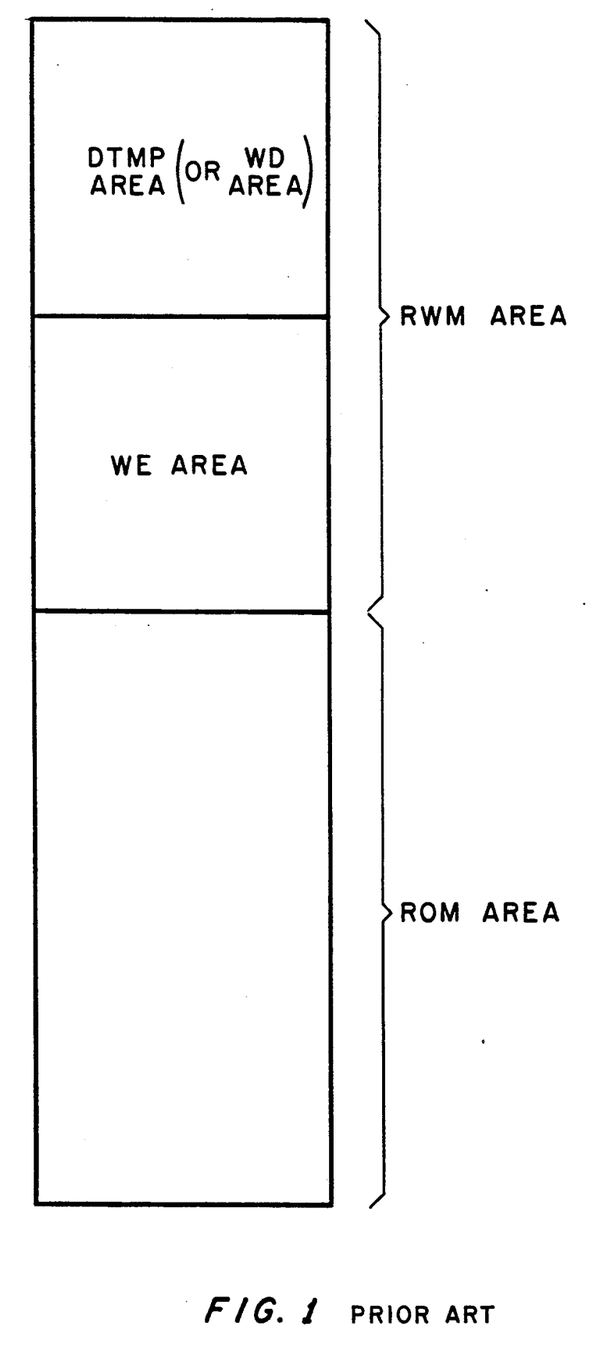
FIG. 1 a memory map showing a specific memory allocation available with a prior art system.

FIG. 1 shows an example of a memory map in this kind of systems. In the drawing, the RWM is divided into some areas which include a particular area that inhibits write-in except when a predetermined procedure is performed (hereinafter referred to as a DTMP area) and an area which is freely accessible for write-in (hereinafter referred to as a WE area).

Figure 2:
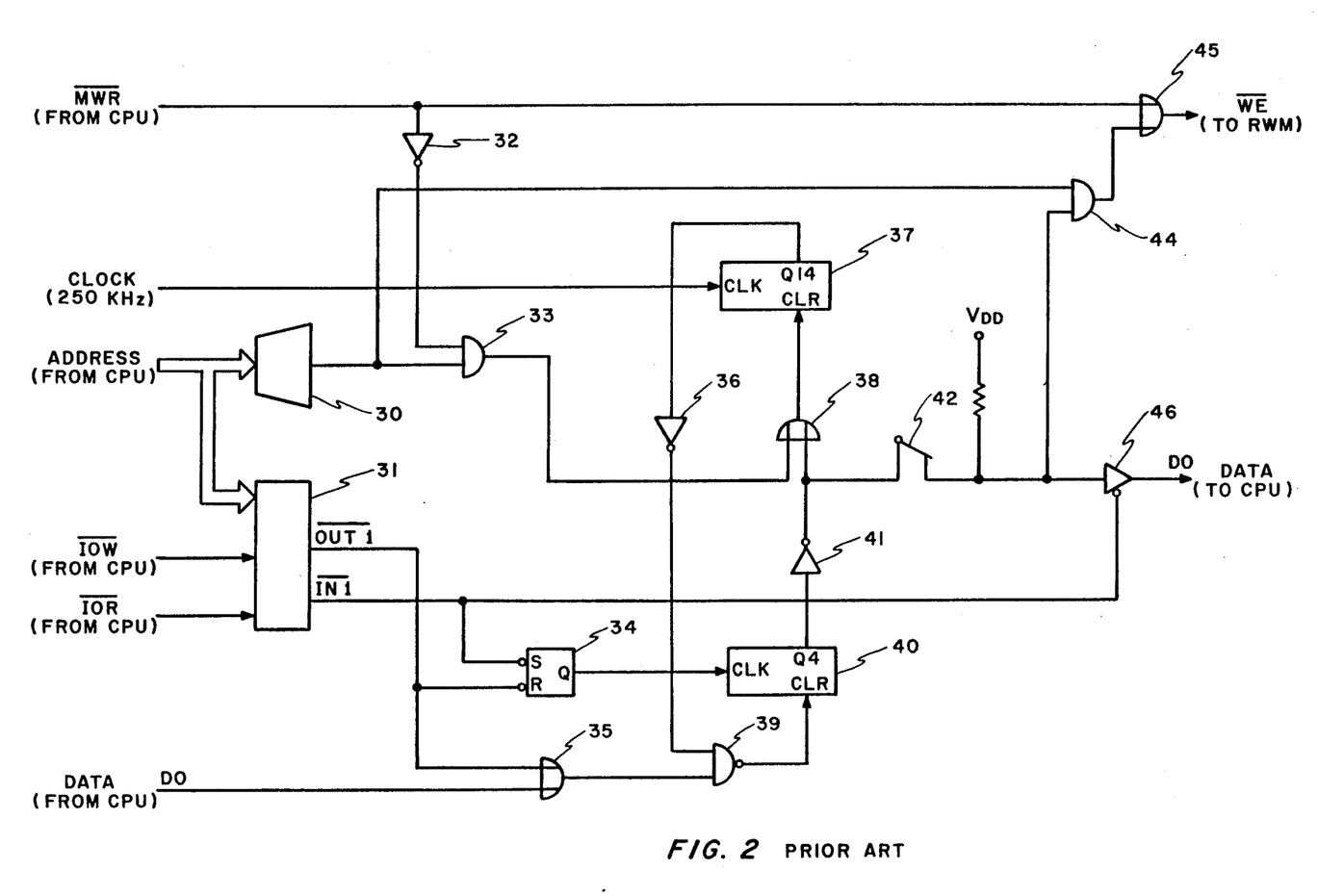
FIG. 2 is a circuit diagram showing a prior art memory write protection circuit schematically.

Referring to FIG. 2, a prior art protection circuit is shown which includes a decoder 30 for designating the DTMP area. The DTMP area is set up only when the logic of an address entered via an address bus and the logic set in the decoder 30 beforehand are coincident, i.e., it is determined by the hardware of the decoder 30.

The CPU delivers an I/O (Input/Output) read signal $\overline{IOR}$, an I/O write signal $\overline{IOW}$ and address to an order developing circuit 31. In response, the order developing circuit 31 produces a first input command ($\overline{IN1}$) and a first output command ($\overline{OUT1}$, where DO="H") on the basis of the combination of the three inputs.

To cancel write protection, the two different commands $\overline{IN1}$ and $\overline{OUT1}$ are produced eight times alternately. This sets and resets an SR flip-flop 34 eight consecutive times, turning an output $Q_4$ of a counter 40 from low level or "L" to high level or "H". The change in the output $Q_4$ of the counter 40 appears as data DO which is sent via an inverter 41, a switch 42 and a 3-state buffer gate 46. The CPU scans for such data DO by using the input command, or read command, $\overline{IN1}$. Subsequently, when an address for memory access is entered, the decoder 30 produces an output ("H"). This decoder output and the output $Q_4$ of the counter 40 turns the output of an AND gate 44 from "H" to "L", resulting in a memory write signal $\overline{MWR}$ becoming valid via an OR gate 45.

Consequently, write protection is cancelled to allow a write enable signal $\overline{WE}$ to be fed to the RWM. The turn of the output $Q_4$ of the counter 40 to sends a signal through invertor 41 and OR gate 38 to change the CLR input of counter 37 from "H" to "L" and start counting clock pulses (250 kilohertz). As 32 milliseconds expire, the output $Q_{14}$ of the counter 37 becomes "H". Then, the counter 40 is reset via an inverter 36 and NAND gate 39 so that the DTMP area is again protected against the write-in of data.

When data is written in the DTMP area while the protection is cancelled, the signal $\overline{MWR}$ resets the counter 37 via an inverter 32, an AND gate 33, and the OR gate 38, thereby causes counter 37 to again start counting from 0 (zero). As a result, the write protection cancelling time is prolonged.

Conversely, when the first output command ($\overline{OUT1}$, where DO="L") is entered, it will clear the counter 40 via an OR gate 35 and a NAND gate 39 to set up the protection immediately. Further, when the switch 42 is brought to an OFF state, the DTMP area designated by the decoder 30 will turn out to be a WD area which does not allow any data to be written therein even when the protection cancelling procedure (stated above) is performed.

The prior art protection circuit having the above construction has some problems which are left unsolved. Specifically, since the DTMP area is determined by the logic which is set up by the decoder 30, the allocation of areas in the RWM is unchangeable, i.e., it lacks flexibility. This obstructs the efficient use of the RWM in the event of software program construction in the CPU, due to the limitation on the use of the areas of the RWM. Another problem is that only one of the DTMP and WD areas can be set up at a time. Moveover, they are changed over by the switch 42, resulting in unflexible and inefficient manipulations.

SUMMARY OF THE INVENTION

It is, therefore, an object of the present invention to provide a memory write protection circuit which allows areas to be allocated and their protection characteristic to be selected and set with flexibility and by efficient manipulations.

In accordance with the present invention, a memory write protection circuit validates a write strobe signal, which allows a write access to a read-write memory which is controlled by a central control circuit. Write access is granted only after a predetermined procedure has been executed in response to a command from the central control circuit. A first setting means is responsive to a command from the central control circuit for setting first information which discriminates a plurality of areas defined in the memory with respect to whether they are writable/non-writable area. Second setting means is responsive to a command from the central control circuit for setting second information which discriminates the plurality of areas whether they are given respect to with write protection/without write protection. Output means outputs from the first and second setting means the first and second information which are associated with areas among the plurality of areas, which are a designated area in which the central control circuit is able to write data. Deciding means determines a kind of the designated area on the basis of a combination of the information output by the output means and thereby decides whether or not the write strobe signal is valid.

BRIEF DESCRIPTION OF THE DRAWINGS

The above and other objects, features and advantages of the present invention will become more apparent from the following detailed description taken with the accompanying drawings in which.

In the drawings, the same components and structural elements are designated by the same reference numerals.

DESCRIPTION OF THE PREFERRED EMBODIMENT

Figure 3:
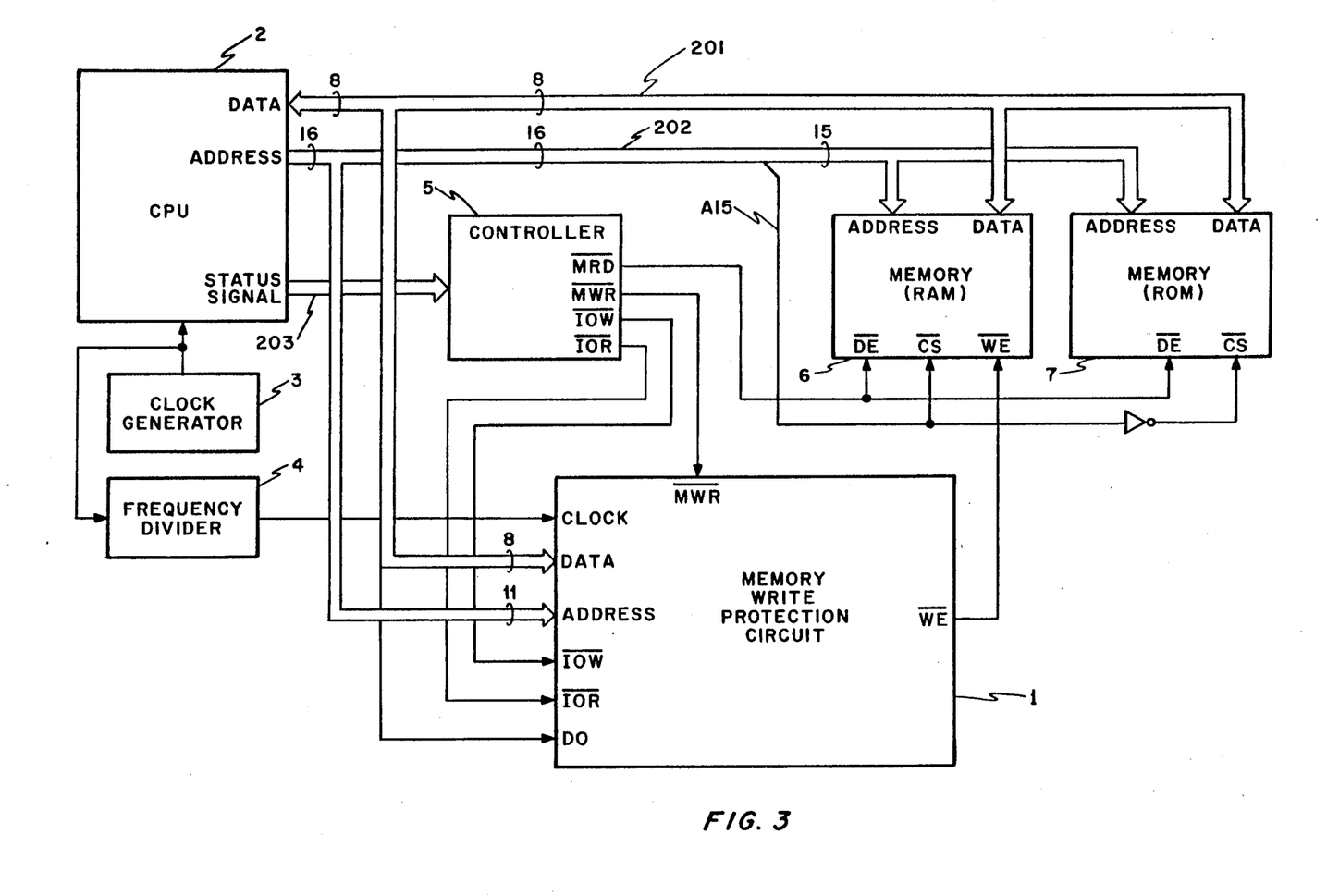
FIG. 3 is a schematic block diagram showing a system to which an embodiment of the present invention is applied.

FIG. 3 shows a system to which a preferred embodiment of the present invention is applied. The system is generally made up of a memory write protection circuit 1, a CPU 2 (e.g., a processor "μPD 70008" which is available from the NEC Corporation), a clock generator 3, a frequency divider 4, a system controller 5, a RWM 6, and a ROM (Read Only Memory) 7.

The CPU 2, the RWM 6, the ROM 7 and the protection circuit 1 are interconnected by an 8-bit, two-way data bus 201. The CPU 2 delivers an address output to the RWM 6, the ROM 7, and the protection circuit 1 via an address bus 202. The CPU 2 also feeds a status signal over bus 203 to the system controller 5. The system controller 5 converts the status signal 203 into I/O access signals $\overline{IOR}$ and $\overline{IOW}$ and memory access signals $\overline{MRD}$ and $\overline{MWR}$.

The clock generator 3 feeds a basic clock pulse train to the CPU 2. The frequency divider 4 divides the basic clock, to produce pulses having the frequency of 250 kilohertz. The output clock pulse train of the frequency divider 4 is applied to the protection circuit 1.

The RWM is implemented as a 32 kilobytes×8 bits static RAM (random access memory). The RWM 6 has a terminal $\overline{CS}$ to which one bit A15 of the address bus 202 is applied as a memory select (chip select) signal.

One bit D0 on the data bus 201 is applied to the protection circuit 1 together with the memory write signal $\overline{MWR}$, I/O write signal $\overline{IOW}$ and I/O read signal $\overline{IOR}$, all of which are fed from the controller 5.

Constituting the heart of the present invention, the protection circuit 1 allows a write access to the RWM 6 by delivering a write enable signal $\overline{WE}$ to the RWM 6. Details of the protection circuit 1 will be described later.

To read data out of the RWM 6 or ROM 7, the CPU 2 manipulates a status signal 203 to feed a memory read signal $\overline{MRD}$ to the terminal $\overline{DE}$ of the memories 6 or 7. At the same time, the CPU 2 applies a memory address to the memory, 6 or 7 which is represented by the bits A0 to A14 (fifteen bits in total) on the address bus 202, while selecting a chip (i.e. RWM area or ROM area) by the bit A15.

To write data into the RWM 6, the CPU 2 sends the designated address of the RWM area over the address bus 202 and, at the same time, feeds the address and the memory write signal $\overline{MWR}$ to the protection circuit 1. The protection circuit 1, therefore, controllably produces the write enable signal $\overline{WE}$ according to the kind of the area (WD/WE/DTMP), which is predetermined on an area by area basis, beforehand.

Figure 4:
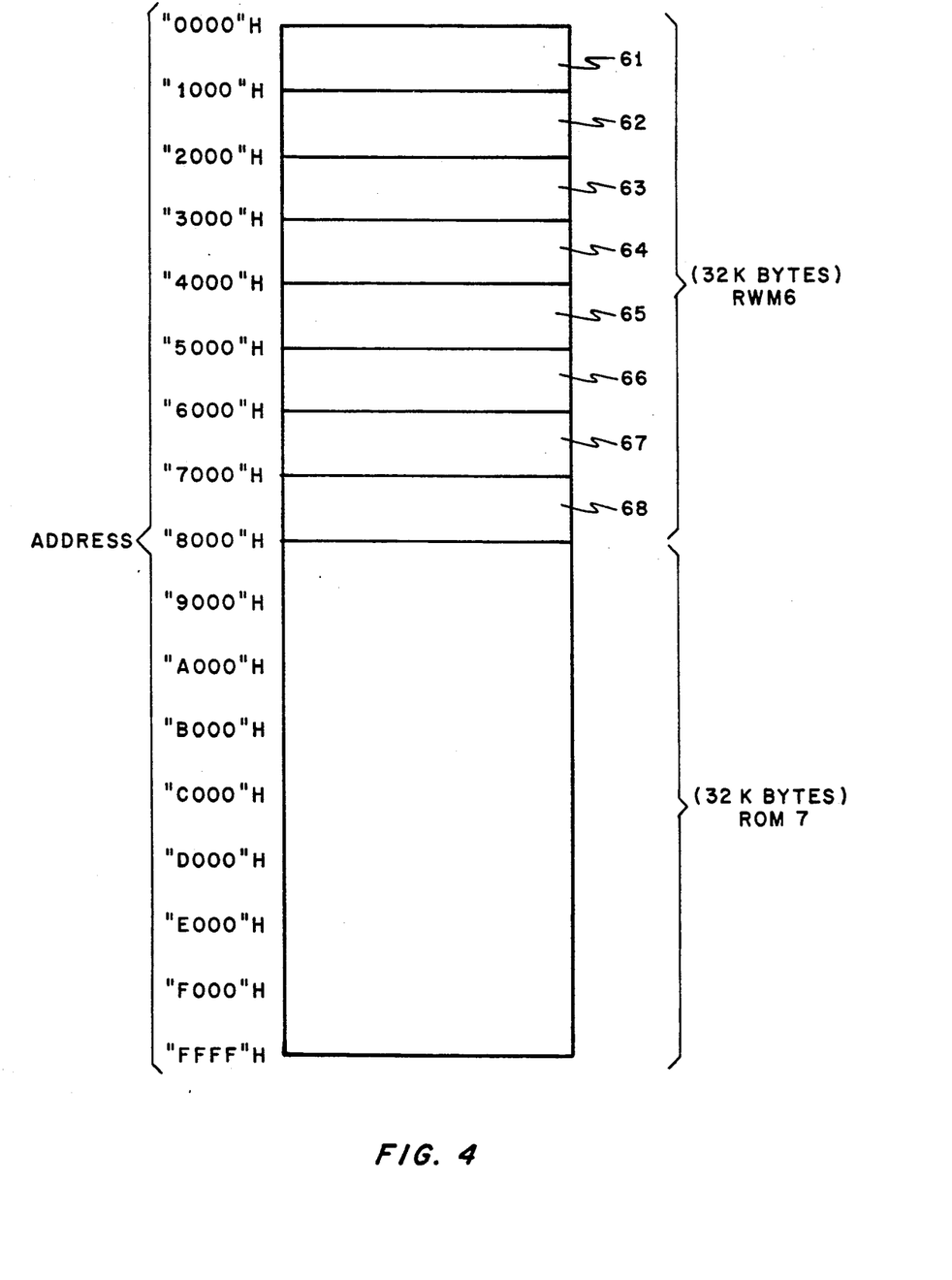
FIG. 4 is a memory map showing a specific memory allocation which is applicable to the system of FIG. 3.

FIG. 4 indicates a specific allocation of the memory area. As shown, in illustrative embodiment, the RWM 6 is divided into eight areas 61 to 68 each having 4 kilobytes. The areas may individually serve as many as described of the different kinds of areas, i.e., DTMP areas, WE areas, and WD areas.

Figure 5:
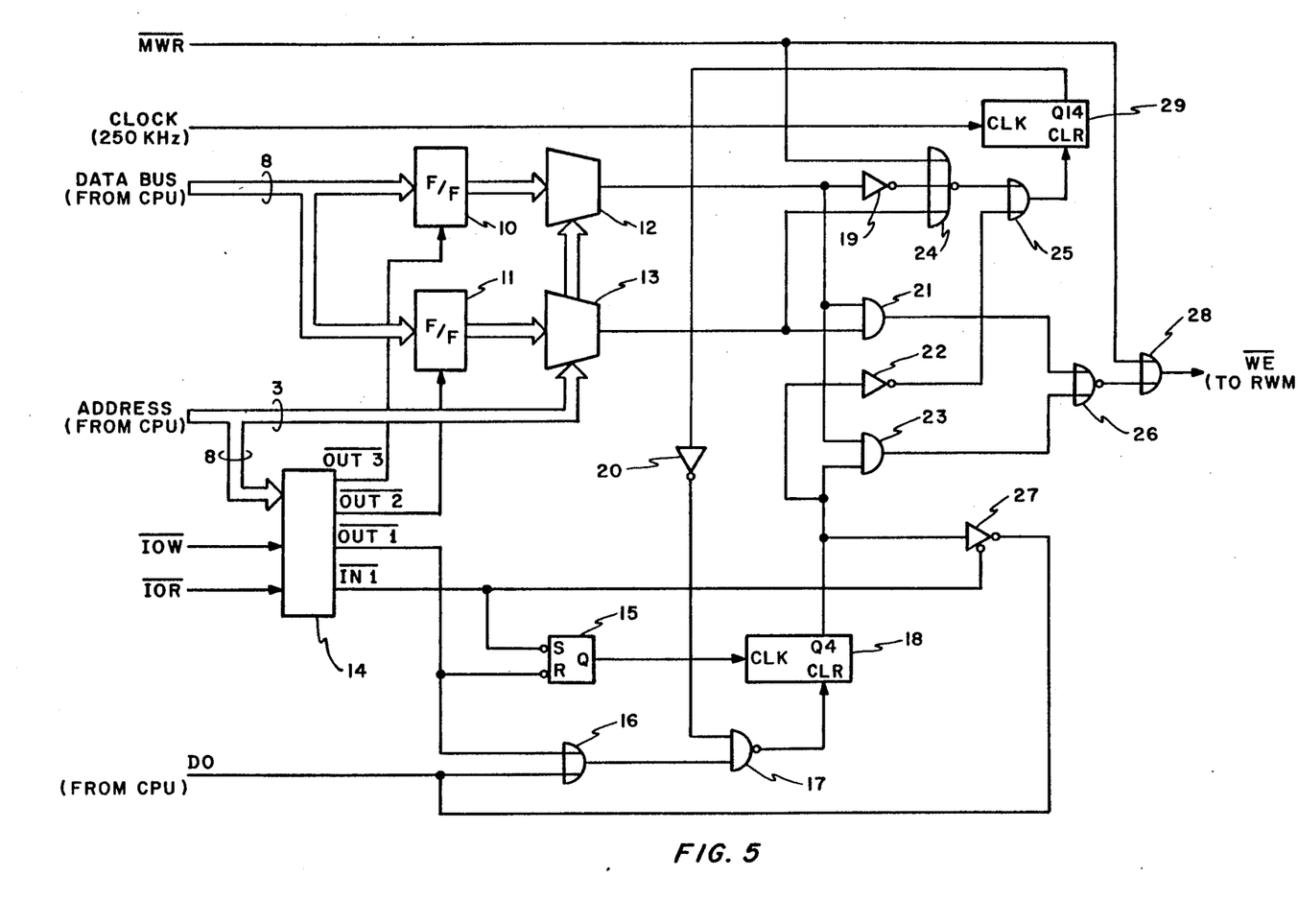
FIG. 5 is a schematic block diagram showing a memory write protection circuit embodying the present invention.

FIG. 5 shows the memory write protection circuit 1 embodying the present invention. As shown, the protection circuit 1 has two 8-bit flip-flop (F.F.) circuits 10 and 11, two selectors 12 and 13 each being connected to a respective one of the F.F. circuits 10 and 11, an order developing circuit 14 responsive to a 8-bit address and signals $\overline{LOW}$ and $\overline{IOR}$ for producing control commands $\overline{IN1}$ and $\overline{OUT1}$ to $\overline{OUT3}$ one at a time, a SR F.F.15, 2-input OR gates 16, 25 and 28, a 2-input NAND gate 17, a counter 18 which is clocked by an output Q of the F.F.15, inverters 19, 20 and 22, 2-input AND gates 21 and 23, a 3-input NOR gate 24, a 2-input NOR gate 26, a 3-state buffer gate 27, and a timer 29 which is responsive to the clock pulse train (250 kilohertz) for counting 32 milliseconds.

The F.F circuits 10 and 11 store information representative of the kind of an area which is in association with the individual areas of the RWM 6.

The selectors 12 and 13 read out of their associated F.F circuits 10 and 11 information which is representative of the kind of a memory area to be accessed.

The F.F 15, the gates 16 and 17, the counter 18 and the buffer gate 27, in combination, constitute a circuit for enabling a memory access when identified by a predetermined operation for cancelling the protection of the DTMP area. The protection of the DTMP areas will be cancelled if the F.F 15 is set and reset eight consecutive times by the input command $\overline{IN1}$ and the output command $\overline{OUT1}$ from the order developing circuit 14.

The gates 21, 23, 26 and 28 cooperate as a circuit for applying the signal $\overline{WE}$ to the RWM 6 based on the kind-of-area information and the state of the write protection.

The inverters 19, 20 and 22, the gates 24 and 25 and the timer 29 constitute a circuit for allowing data to be written in the RWM 6 only for the 32 millisecond period after the cancellation of the DTMP area write protection. It is to be noted that when a memory access is given, the write protection is applied again upon the lapse of 32 milliseconds after the end of the access.

Figure 6:
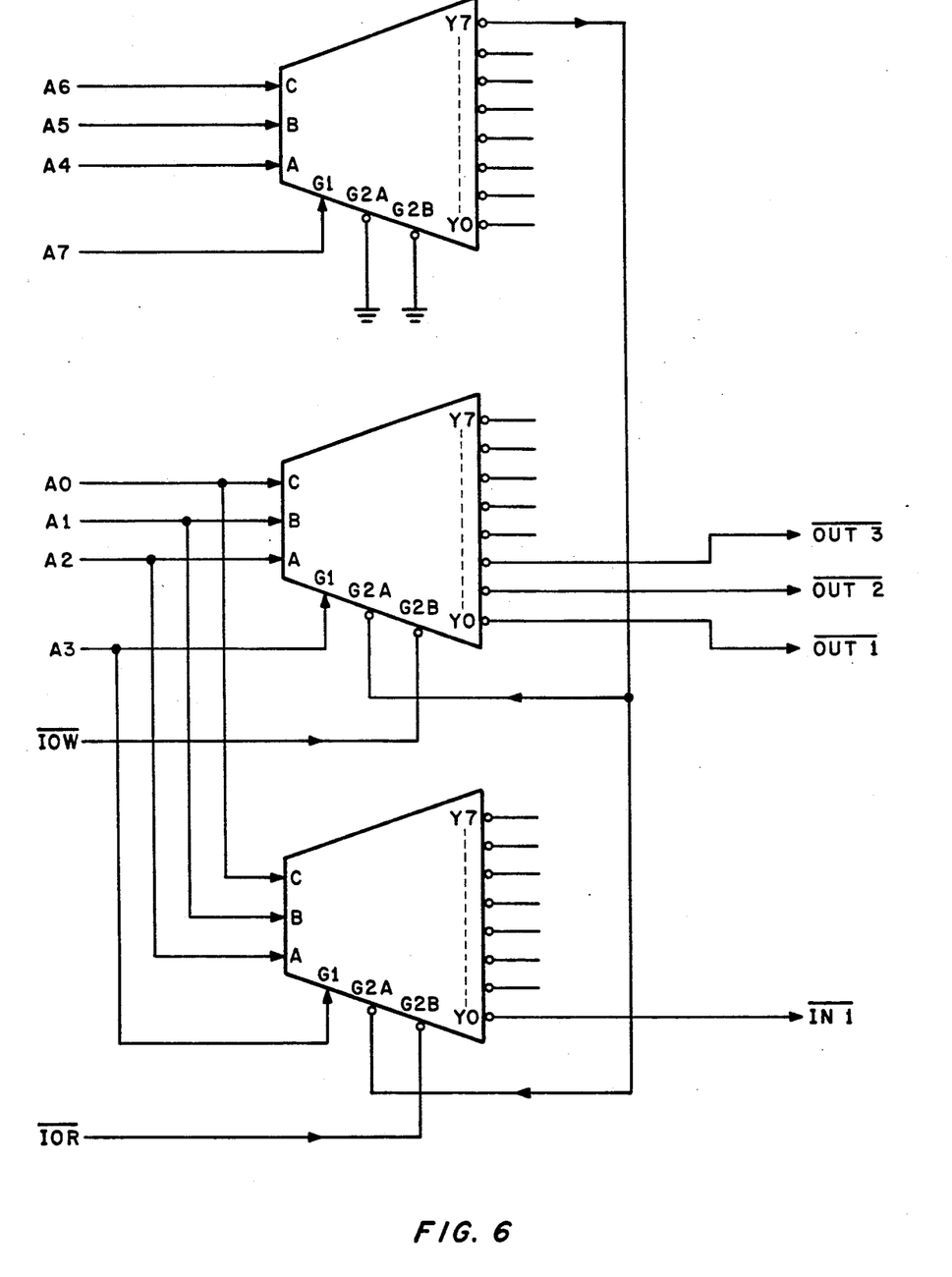
FIG. 6 is a circuit diagram showing a specific construction of an order developing circuit included in the circuitry of FIG. 5.

FIG. 6 shows a specific construction of the order developing circuit 14. The circuit 14 serves as a kind of decoder circuit which receives the lower eight bits (A0 to A7) on the address bus 202 and the signals $\overline{IOW}$ and $\overline{IOR}$. Circuit 14 can be implemented by three decoders "μPD 74HC-138" which are available from NEC Corporation, for example.

The first input command $\overline{IN1}$ and the first output command $\overline{OUT1}$ are used to cancel the DTMP area write protection. The second output command $\overline{OUT2}$ is a command for latching data in the F.F. circuit 11. The third output command $\overline{OUT3}$ is a command for latching data in the F.F. circuit 10. The signal $\overline{IOR}$ appears when the CPU 2 is to read data. The input command $\overline{IN1}$ appears on the basis of the combination of the signal $\overline{IOR}$ and address. On the other hand, the signal $\overline{IOW}$ appears when the CPU 2 is ready to produce data. The output commands $\overline{OUT1}$ to $\overline{OUT3}$ appear on the basis of the combination of the signal $\overline{IOW}$ and address.

Specifically, in the circuit shown in FIG. 6, the input command $\overline{IN1}$, the output command $\overline{OUT1}$, the output command $\overline{OUT2}$ and the output command $\overline{OUT3}$ appear respectively in response to the entry of a lower eight-bit address (i.e., bits A0 to A7) "F8"H (in hexadecimal notation) and signal $\overline{IOR}$, the entry of the lower eight-bit address "F8"H and signal $\overline{IOW}$, the entry of a lower eight-bit address "F9"H and signal $\overline{IOW}$, and the entry of a lower eight-bit address "FA" and signal $\overline{IOW}$.

Figure 7:
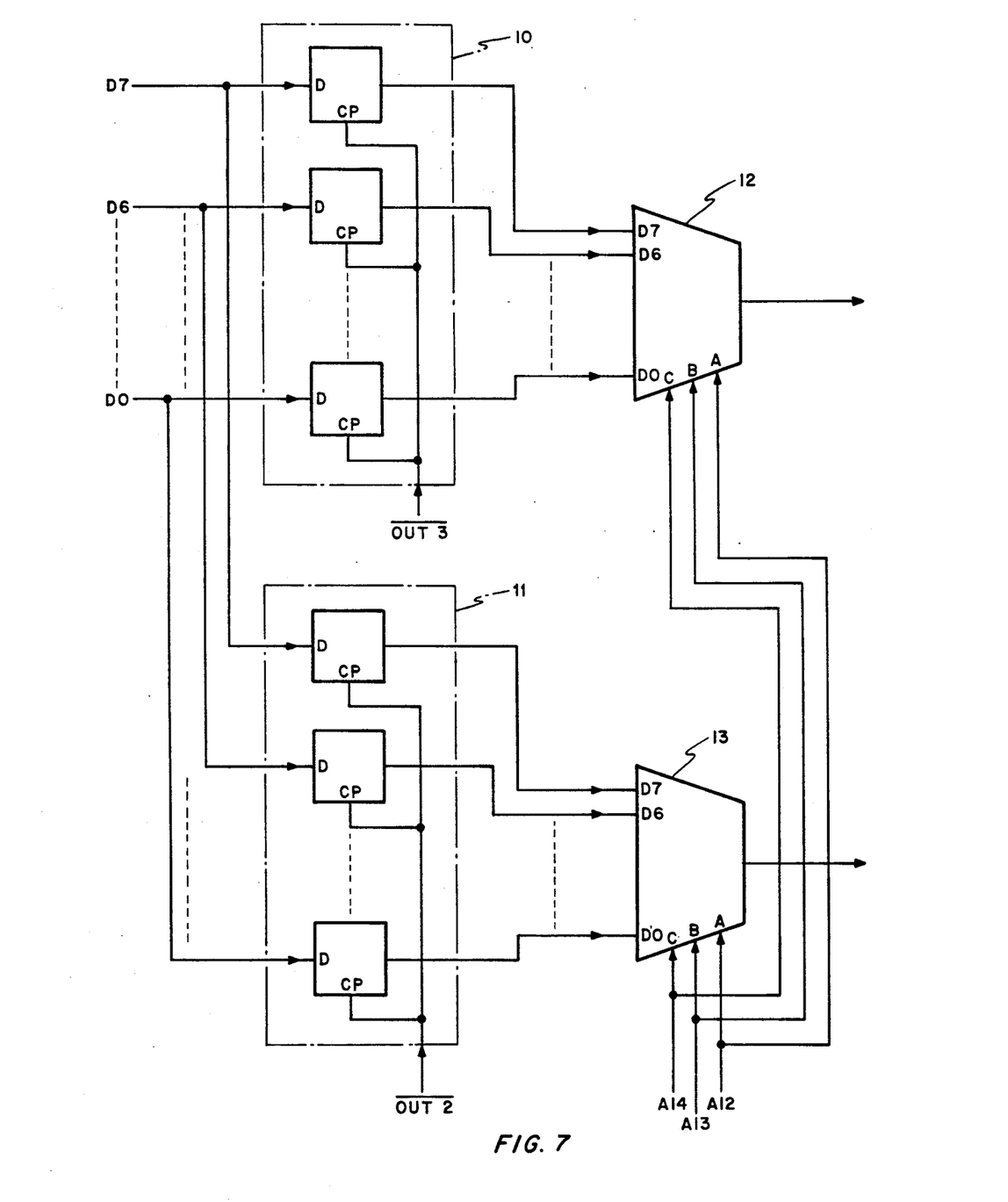
FIG. 7 is a circuit diagram showing details of flip-flop circuits and selectors which are also included in the circuitry of FIG. 5.

FIG. 7 describes the F.F. circuits 10 and 11 and the selectors 12 and 13. As shown, each of the F.F. circuits 10 and 11 has eight D flip-flops each being connected to receive a respective one of the bits D0 to D7 on the data bus 201. The bits D0 to D7 are individually associated with eight areas 61 to 68 which are defined in the RWM 6, as previously stated.

In response to the output command $\overline{OUT3}$, the F.F. circuit 10 memorizes the discrimination among the areas 61 to 68, with respect to the area WE/WD. The other F.F. circuit 11 stores the discrimination among the areas 61 to 68, with respect to DTMP-OFF/DTMP-ON. Referring to FIG. 4, since each of the areas 61 to 68 is defined every "1000"H (represented by hexadecimal notation) in the address to have the 4-kilobyte memory size, an actual memory access is executed with the thirteen to fifteen bits A12 to A14 of a memory address being applied to the selectors 12 and 13. Hence, outputs of those F.F.s which are associated with the designated area are selected out of the F.F. circuits 10 and 11.

Figure 8:
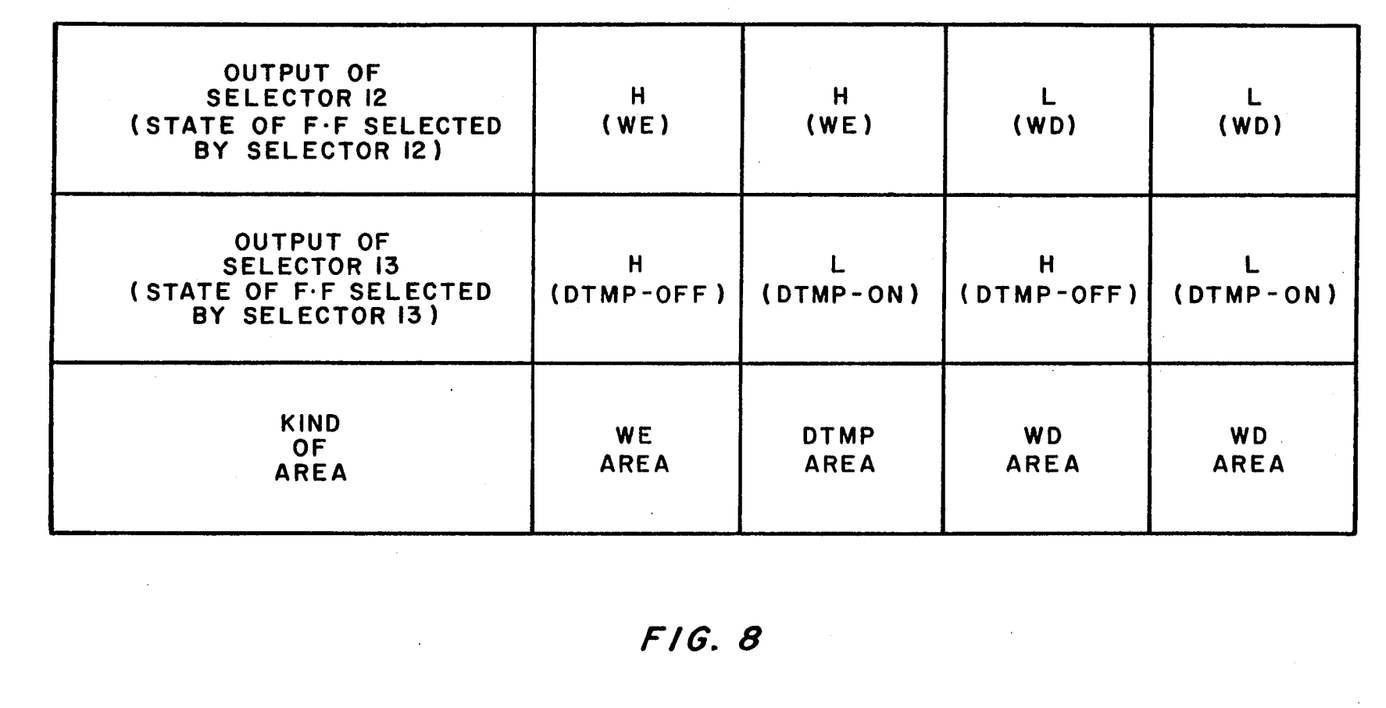
FIG. 8 is a table indicating a kind-of-area information which is associated with a RWM area.

FIG. 8 indicates the meaning of two different kind116 information mean in a table. As FIG. 8 shows, when the output of the selector 12 is "L", the designated area will be the WD area with no regard to the output of the other selector 13. When the output of the selector 12 is "H", the designated area will be the WE area if the output of the selector 13 is "H" and the DTMP area if the latter is "L". The circuits 10 and 11 and the selectors 12 and 13 may advantageously be implemented by IC "$\mu$PD 74 HC-374" and IC "$\mu$PD 74 HC-251", respectively, both of which are available from NEC Corporation.

Figure 9:
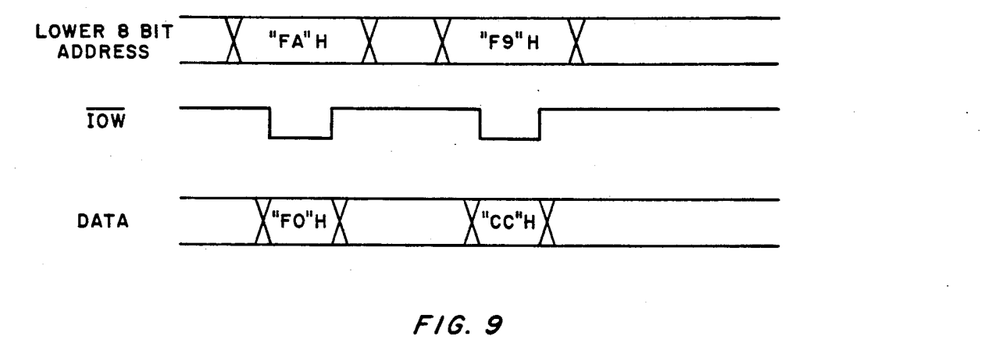
FIGS. 9 and 10 demonstrate how the kind-of-area information is set.
Figure 10:
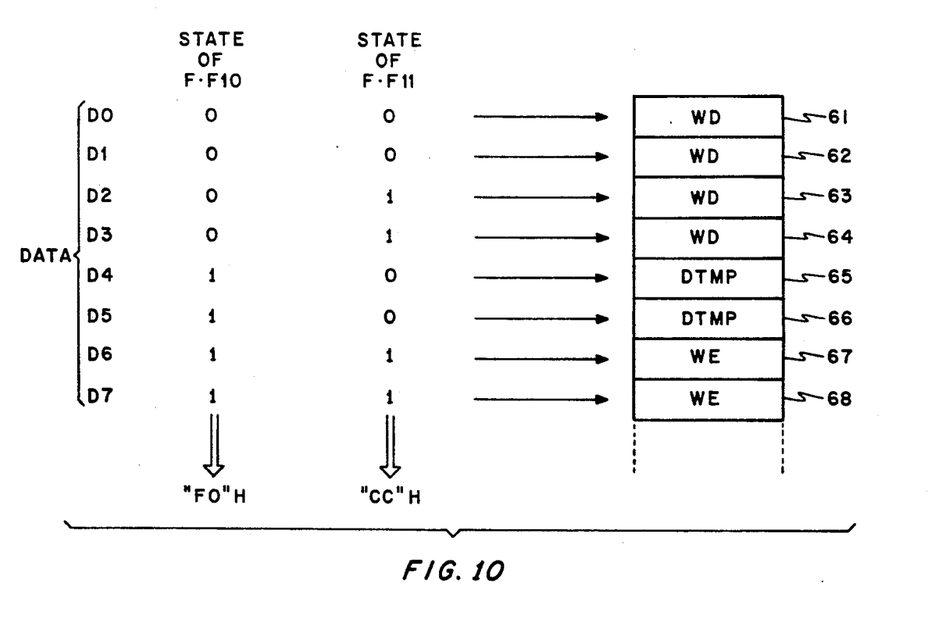

FIGS. 9 and 10 show how the kind-of-area information is written. When a lower eight-bit address "FA"H (in hexadecimal notation) and siganl $\overline{IOW}$ are fed to the order developing circuit 14, the output command $\overline{OUT3}$ is produced so that the data "F0"H which is then appearing is memorized by the F.F. circuit 10. Subsequently, when a lower eight-bit address "F9"H and input $\overline{IOW}$ are applied to the circuit 14, the output command $\overline{OUT2}$ is produced, thus resulting in the instantaneous data "CC"H being memorized by the F.F. circuit 11. In this condition, the different kinds of areas are assigned to areas 61 to 68, as shown in FIG. 10.

Figure 11:
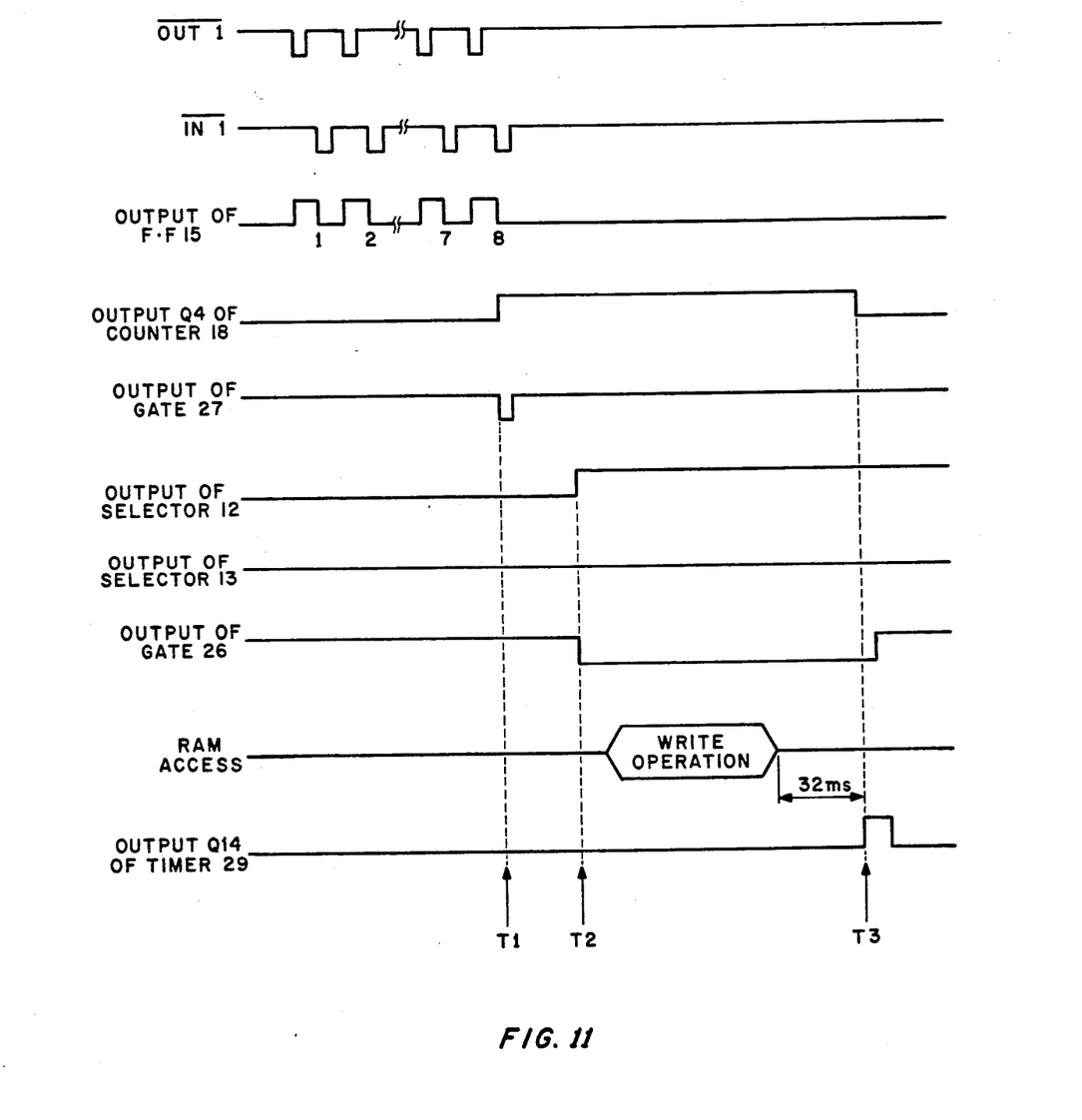
FIG. 11 is a timing chart which is useful for understanding the operation of the illustrative embodiment.

FIG. 11 demonstrates a procedure for accessing the RWM 6 in a timing chart. To access the area 65 which is a DTMP area, the output command $\overline{OUT1}$ and the input command $\overline{IN1}$ (D0 being "H" for $\overline{IN1}$) developed in the order developing circuit 14 are executed eight times alternately in order to set and reset the F.F. 15 eight times. On the eighth setting of the F.F 15, the output $Q_4$ of the counter 18 turns from "L" to "H" and, in this instance, the write protection is cancelled. When the input command $\overline{IN1}$ appears, the CPU 2 is capable of reading data; the CPU 2 reads the output $Q_4$ of the counter 18 via the 3-state buffer gate 27 in response to the eighth command $\overline{IN1}$. Then, the output of the gate 27 (data D0) changes from "H" to "L" informing the CPU 2 of the cancelleration of the write protection (time $T_1$).

Subsequently, an address "4000"H (in hexadecimal notation) designating the area 65 and the signal $\overline{MWR}$ are entered (time $T_2$). Then, the selectors 12 and 13 individually output data bit D4 which is associated with the area 65, i.e., output of 12="H" and output of 13="L". This brings the output of the gate 26 into "L" with the result that the memory write signal $\overline{MWR}$ ("L") is fed to the RWM 6 via the gate 28 as a write enable signal $\overline{WE}$, thereby allowing data to be written in.

As the output $Q_4$ of the counter 18 changes from "L" to "H", the input CLR of the counter 29 is turned to "L" via the inverter 22 and the OR gate. Therefore, counter 29 starts counting in response to the input clock. On the turn of the output $Q_{14}$ of the counter 29 to "H", the counter 18 is cleared by the output $Q_{14}$ via the inverter 20 and the gate 17, resulting in the area 65 being protected again.

When a writing operation meant for the area 65 is executed while the protection is cancelled (time $T_2$), the signal $\overline{MWR}$ clears the counter 29 via the NOR gate 24 and the OR gate 25, thereby prolonging the protection cancelling time. More specifically, if 32 milliseconds expire without the signal $\overline{MWR}$ being turned to "L" after the end of writing, the output $Q_{14}$ of the counter 29 becomes "L" (time $T_3$) and the counter 18 is reset. As a result, the output of the gate 26 changes from "L" to "H" so that the signal $\overline{MWR}$ is protected by the OR gate 28 (write protect state). Further, the output of the selector 12 is fed to the NOR gate 24 via the inverter 19 while the output of the selector 13 is directly fed to the NOR gate 24, in order to confirm the conditions associated with the DTMP area. The output command OUT1 (D0="L") may be executed immediately after the end of the write access to the RWM 6 so as to clear the counter 18 via the NAND gate 17. This is successful in saving the waiting time of 32 milliseconds which is necessary to set up the write protect state.

Assume that one inadvertently tries to access the area 61 which is a WD area. Then, both the outputs of the selectors 12 and 13 are "L"; hence, the output of the NOR gate 26 is "H". In this condition, the signal $\overline{WE}$ does not turn to "L" even when the signal $\overline{MWR}$ is entered (inhibiting write access). This is also true even after an operation for cancelling the protection has been performed.

When the area 67 which is a WE area is accessed for writing data therein, both of the outputs of the selectors 12 and 13 are "H" so that the output of the NOR gate 26 is "L", with no regard to the output $Q_4$ of the counter 18. Hence, the signal $\overline{MWR}$ is not protected by the OR gate 28, thus allowing data to be freely written in the RWM 6.

While the illustrative embodiment has been shown and described as using eight independent memory areas each having a size of 4 kilobytes, such specified numerical values are only illustrative and may be selected as desired depending on the number of bits of the F.F. circuits 10 and 11 and the selection logic of the selectors 12 and 13. These numerical values are determined by hardware, but the kind of an area is programmable on an area by area basis.

In summary, it will be seen that the present invention allows each of different areas of a RWM to selectively play the role of a DTMP area, WE area and WD area as desired.

What is claimed is:

1. A memory write protection circuit for validating a memory write access signal, which enables a write access to a random access memory which is controlled by a central control circuit, said validation occurring after a predetermined procedure has been executed in response to a command from said central control circuit, said protection circuit comprising:

first setting means responsive to a command from the central control circuit for setting first information which discriminates between a plurality of areas defined in the memory, said discrimination being made with respect to whether each of said areas is a writable area or a non-writable area;

second setting means responsive to a command from the central control circuit for setting second information which discriminates among the plurality of areas with respect to which are with write protection or without write protection;

output means for outputting from said first and second setting means said first and second information which are associated with a designated area, among the plurality of area, in which the central control circuit is able to write data;

deciding means for identifying a kind of the designated area on a basis of a combination of the information output by said output means and for deciding whether or not a received memory write access signal is valid;

a protection cancellation detecting circuit for detecting when said central control circuit has executed said predetermined procedure for removing the invalidation of said memory write access signal;

each of said first and second setting means comprising a plurality of flip-flops corresponding in number to the number of said plurality of areas;

said output means comprising two selectors, each of the selectors being associated with a respective one of said first and second setting means for selecting an output of one of said flip-flops which is associated with the designated area on a basis of an address of said designated area;

said deciding means including a timer means which is started responsive to a detection output of said protection cancellation detecting circuit for counting a predetermined period of time, said timer means resetting said detecting circuit upon the elapse of said predetermined period of time for validating said memory write access signal for said period of time;

each of said areas being assigned to one of three kind of memory areas according to a combination said first information and said second information, said three kind of memory areas being a first area that inhibits write-in except when said predetermined procedure is performed, a second area which is freely accessible for write-in, and a third area which does not allow any data to be written therein even when said predetermined procedure is performed;

when said first information output from said first setting means indicates a non-writable area, said deciding means regarding the designated area as said third area and invalidating said memory write access signal with no regard to a content of said second information;

when said first information indicates a writable area and said second information indicates an area with write protection, said deciding means regarding the designated area as said first area and invalidating said memory write access signal until said protection cancellation detecting circuit detects that the central control circuit has executed said predetermined procedure;

when said first information indicates a writable area and said second information indicates an area without protection, said deciding means regarding the designated area as said second area and validating the memory write access signal.

2. A memory write protection circuit as claimed in claim 1, wherein said protection cancellation detecting circuit comprises a flip-flop which is set and reset responsive to commands from the central control circuit, and a counter for counting the number of times that said flip-flop is set and reset.

3. A memory write protection circuit as claimed in claim 1, and means for resetting the timer means when said memory write access signal which is valid appears while said timer is counting the predetermined period of time, whereby a write protection cancellation time is prolonged so long as said valid memory write access signal appears.

4. A memory write protection circuit as claimed in claim 1, and means for resetting said protection cancellation detecting circuit responsive to a command from the central control circuit to again set up write protection after write protection has been cancelled.

* * * * *